United States Patent [19]

Huang et al.

[11] Patent Number: 4,914,049
[45] Date of Patent: Apr. 3, 1990

[54] METHOD OF FABRICATING A HETEROJUNCTION BIPOLAR TRANSISTOR

[75] Inventors: Jenn-Hwa Huang, Gilbert; Luke Mang, Phoenix, both of Ariz.

[73] Assignee: Motorola, Inc., Schaumburg, Ill.

[21] Appl. No.: 421,918

[22] Filed: Oct. 16, 1989

[51] Int. Cl.$^4$ ......................... H01L 21/283
[52] U.S. Cl. ......................... 437/31; 437/33; 437/133; 437/203; 437/228; 437/944; 148/DIG. 11; 148/DIG. 72; 357/34
[58] Field of Search ................ 437/31, 32, 33, 38, 437/133, 203, 228, 944; 357/16, 34; 148/DIG. 72, DIG. 12

[56] References Cited

U.S. PATENT DOCUMENTS

| 4,663,831 | 5/1987 | Birrittella et al. | 148/DIG. 11 |
| 4,731,340 | 3/1988 | Chang et al. | 437/31 |
| 4,751,195 | 6/1988 | Kawai | 437/31 |
| 4,789,643 | 12/1988 | Kajikawa | 437/31 |

FOREIGN PATENT DOCUMENTS 0202963 8/1988 Japan ........................... 437/31

OTHER PUBLICATIONS

Tully et al., "A Fully Planar Heterojunction . . . ", IEEE Electron Dev. Lett., vol. EDL-7, No. 11, Nov. 1986, pp. 615-617.

Primary Examiner—Brian E. Hearn
Assistant Examiner—T. N. Quach
Attorney, Agent, or Firm—Harry A. Wolin

[57] ABSTRACT

A heterojunction bipolar transistor having a planar surface topology, reduced lateral dimensions and a base electrode aligned to both the emitter and collector electrodes is fabricated by forming sub-collector, collector, base and one or more emitter layers on a substrate. An opening extending to the sub-collector layer is then formed and a first portion of the collector electrode is formed therein so that the sidewalls of the opening are not contacted by the first portion. Dielectric material is then formed between the sidewalls of the opening and the first portion of the collector electrode. A second portion of the collector electrode is then formed on the first portion of the collector electrode along with an emitter electrode so that the second portion of the collector electrode and the emitter electrode are substantially planar. After then exposing the base layer, the self-aligned base electrode is formed between the second portion of the collector electrode and the emitter electrode.

14 Claims, 3 Drawing Sheets

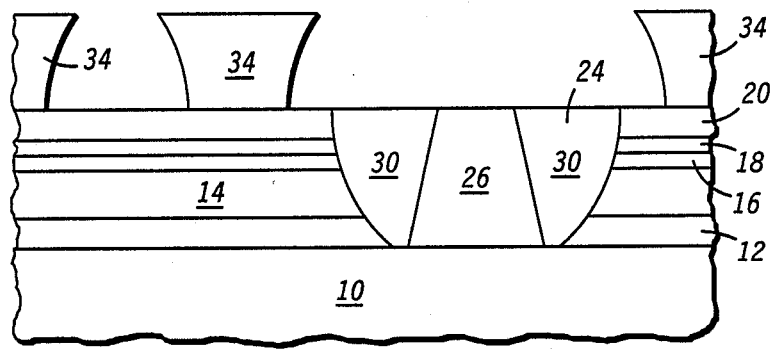
FIG. 7
FIG. 8
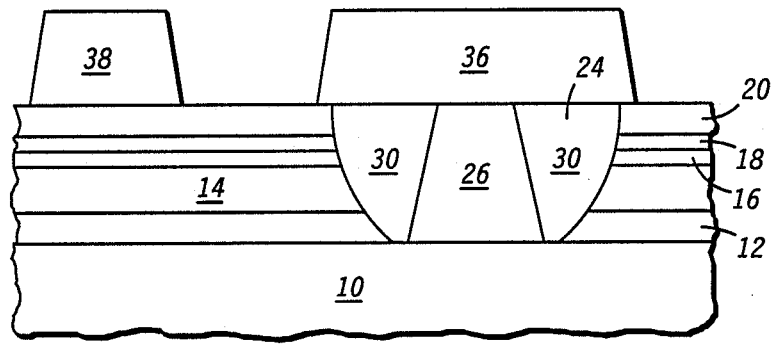

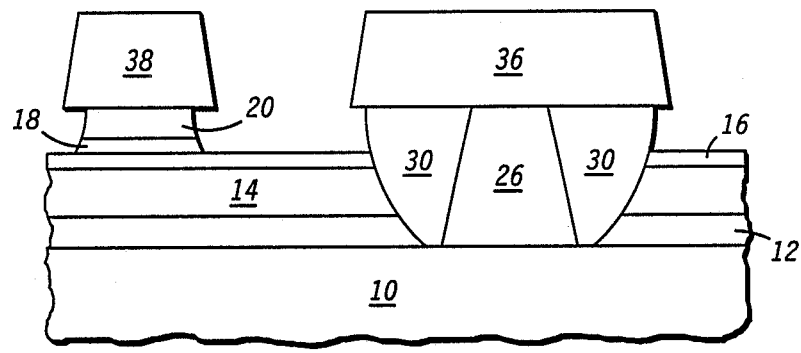
FIG. 9
FIG. 10
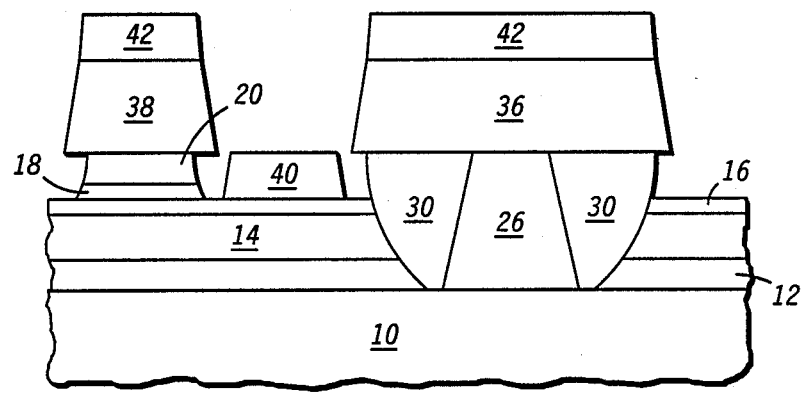

METHOD OF FABRICATING A HETEROJUNCTION BIPOLAR TRANSISTOR

BACKGROUND OF THE INVENTION

This invention relates, in general, to semiconductor device fabrication and more particularly to a method of fabricating a heterojunction bipolar transistor that has relatively planar surface topology and reduced lateral dimensions.

Conventional methods of fabricating heterojunction bipolar transistors include forming collector, base and emitter layers on a substrate. Typically, the processes then form an emitter electrode followed by etching down to the base layer and forming a base electrode. Finally, an opening is etched to the collector layer so that a collector electrode may be formed. These conventional methods generally result in a heterojunction bipolar transistor having non-planar surface topology due to the large height difference between emitter electrode and the collector electrode.

Conventional single self-aligned heterojunction bipolar transistor fabrication processes generally align the base electrode only to the emitter electrode. This self-alignment results in a device configuration wherein the collector electrode is laterally distant from the base electrode. As a result, overall transistor size is sacrificed and the lateral dimensions of the transistor are larger than that obtainable using a process wherein the base electrode is automatically aligned to both the emitter and the collector electrodes.

An article by Tulley et al. entitled "A Fully Planar Heterojunction Bipolar Transistor", IEEE Electron Device Letters, Vol. EDL-7, No. 11, November 1986, page 615, discloses a planar, self-aligned heterojunction bipolar transistor fabrication process. This process utilizes a two-step epitaxial deposition with an intervening selective ion implant of bases. This epitaxial regrowth and selective ion implantation cause the disclosed process to be relatively complicated and difficult to employ.

In view of the above, it would be highly desirable to have a method of fabricating a heterojunction bipolar transistor that is relatively simple, results in a transistor having a relatively planar surface topology and reduced lateral dimensions and wherein the base electrode is self-aligned to both the collector and emitter electrodes.

SUMMARY OF THE INVENTION

Accordingly, it is an object of the present invention to provide a method of fabricating a heterojunction bipolar transistor having a relatively planar surface topology.

Another object of this invention is to provide a method of fabricating a heterojunction bipolar transistor having reduced lateral dimensions.

It is an additional object of the present invention to provide a method of fabricating a heterojunction bipolar transistor wherein the base electrode is aligned to both the emitter and collector electrodes.

The foregoing and other objects and advantages are achieved in the present invention by one embodiment in which, as part thereof, includes forming sub-collector, collector, base and one or more emitter layers on a substrate. An opening is formed that extends to the sub-collector layer and a first portion of the collector electrode is formed therein. Dielectric material is formed in the opening around the first portion of the collector electrode. The simultaneous formation of the emitter electrode and the second portion of the collector electrode on the first portion of the collector electrode enable the emitter and collector electrodes to be substantially planar. After exposing the base layer, a base electrode is formed between the emitter electrode and the second portion of the collector electrode so that it is aligned to both the emitter and collector electrodes.

A more complete understanding of the present invention can be attained by considering the following detailed description in conjunction with the accompanying drawings.

BRIEF DESCRIPTION OF THE DRAWINGS

FIGS. 1-10 illustrate highly enlarged cross-sectional views of a portion of a heterojunction bipolar transistor during fabrication embodying the present invention.

DETAILED DESCRIPTION OF THE INVENTION

Figure 1:
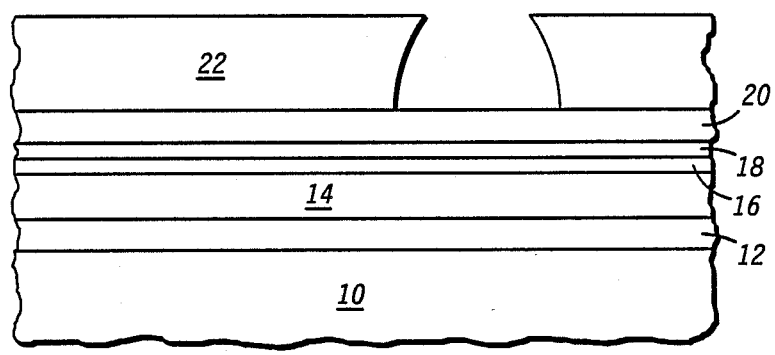

FIGS. 1-10 illustrate highly enlarged cross-sectional views of a portion of a heterojunction bipolar transistor during fabrication embodying the present invention. FIG. 1 shows a substrate 10 having a series of active layers disposed thereon. In this embodiment, substrate 10 comprises semi-insulating gallium arsenide although substrates of other well known materials may be employed. Also in this embodiment, the active layers are sub-collector 12 comprised of gallium arsenide and having an N+conductivity type, collector layer 14 comprised of gallium arsenide and having an N conductivity type, base layer 16 comprised of gallium arsenide and have a P conductivity type, emitter layer 18 comprised of aluminum gallium arsenide and having an N conductivity type and emitter cap layer 20 comprised of gallium arsenide and having an N+conductivity type. These active layers and formed by methods well known in the art. Although an NPN transistor is disclosed herein, it should be understood that the present invention may also be employed to fabricate a PNP transistor.

Figure 2:
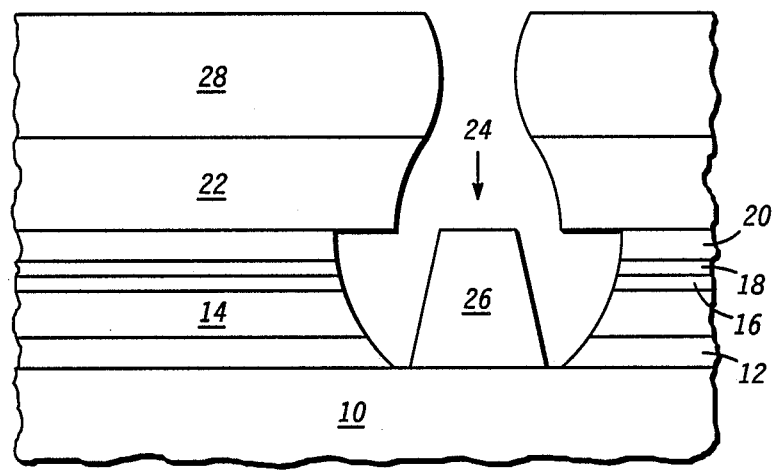

A first photoresist mask 22 is formed on emitter cap layer 20 and is used to form an opening 24 that extends through emitter cap layer 20, emitter layer 18, base layer 16, collector layer 14 and stops on sub-collector layer 12 as shown in FIG. 2. Opening 24 may be formed by employing a wet isotropic etch of dilute phosphoric acid or one of many other wet, dry or combination of wet and dry etches well known in the art. It should be understood that these etches should etch laterally in opening 24 as well as vertically. This enables opening 24 to undercut first photoresist mask 22. The importance of this undercut will be explained presently.

First portion 26 of the collector electrode is formed in opening 24 employing first photoresist mask 22. Standard deposition techniques are used. It is essential that first portion 26 does not touch the sidewalls of opening 24. Therefore, in order to employ first photoresist mask 22 in the deposition off first portion 26, it is important that the etching of opening 24 undercut first photoresist mask 22 as described above.

First portion 26 comprises a layer of gold-germanium alloy disposed directly on sub-collector layer 12, a layer of nickel disposed on the alloy layer and a layer of gold disposed on the nickel layer. It should be understood that first portion 26 may also comprise other metal schemes. Further, first portion 26 should be substantially planar with the top surface of emitter cap layer 20.

Figure 3:
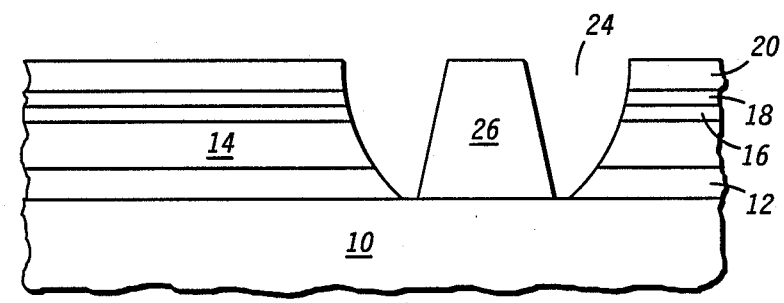

During the formation of first portion 26, excess metal 28 will deposit on first photoresist mask 22. First photoresist mask 22 and excess metal 28 are removed following the formation of first portion 26 by a lift-off process and the resultant structure is depicted in FIG. 3.

Figure 4:
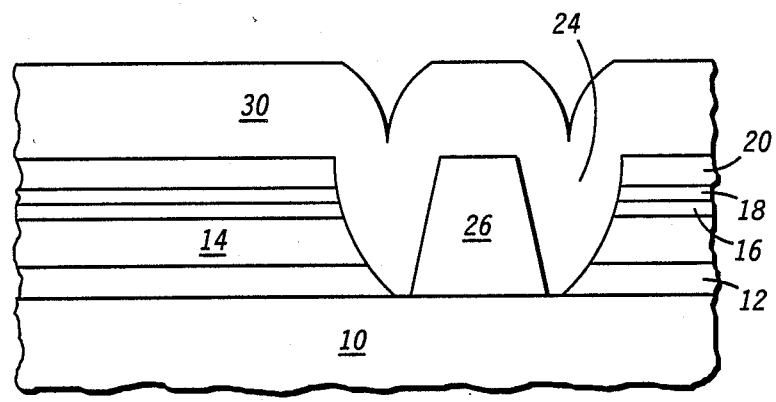
Figure 5:
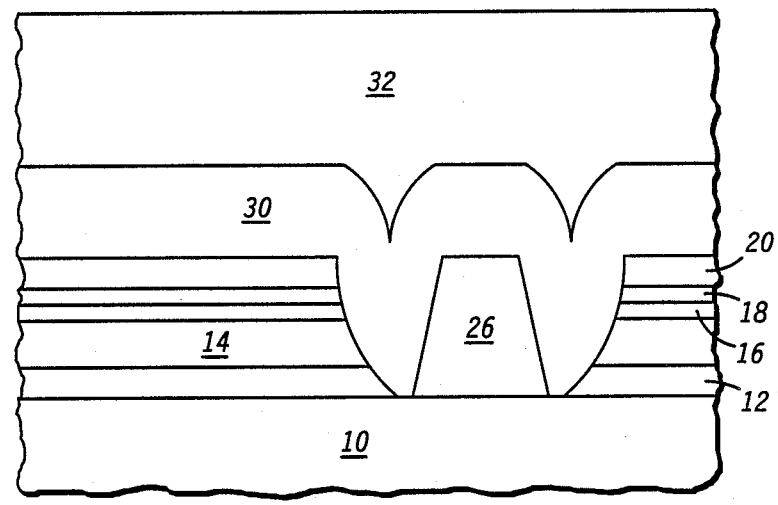
Figure 6:
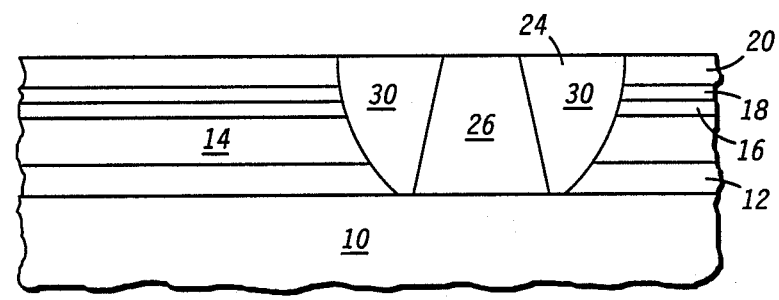

Now referring to FIG. 4, a dielectric layer 30 is formed on the structure following the lift-off procedure. It should be understood that dielectric layer 30, silicon dioxide in this embodiment, also fills opening 24 around first portion 26. As shown in FIG. 5, a photoresist layer 32 is then formed on dielectric layer 30. Photoresist layer 32 may be spun-on or applied by other methods well known in the art. Photoresist layer 32 and dielectric layer 30 are then etched away, preferably using reactive ion etching with fluorine chemistry. This etch results in a planar structure as shown in FIG. 6. The portions of dielectric layer 30 disposed in opening 24 are not etched away and remain to insulate first portion 26 from active layers 14, 16, 18 and 20.

As shown in FIG. 7, a second photoresist mask 34 is formed on the planarized structure. Mask 34 is used to form second portion 36 of the collector electrode above first portion 26 and also to form emitter electrode 38 as shown in FIG. 8. In this embodiment, both second portion 36 and electrode metal 38 are formed of a layer of gold-germanium alloy, a layer of nickel disposed on the alloy layer, and a layer of gold disposed on the nickel layer.

Following the formation of second portion 36 and emitter electrode 38, emitter cap layer 20 and emitter layer 18 are etched away excepting those portions disposed beneath emitter electrode 38 as shown in FIG. 9. It should be understood that the removal of layers 20 and 18 expose base layer 16. The etch of layers 20 and 18 is preferably done with a well known wet etch so that undercutting of emitter electrode 38 occurs. However, one of skill in the art will understand that it is also possible to employ a dry etch or a combination of wet and dry etches to achieve the undercutting.

Following the removal of layers 20 and 18, base electrode 40 is formed on base layer 16 between second portion 36 and emitter electrode 38. In this embodiment, base electrode 40 comprises a layer of titanium upon which is formed a layer of platinum and then a layer of gold although other metal schemes may be employed. It should be understood that the process disclosed herein allows for base electrode 40 to be self-aligned with both second portion 36 of the collector electrode and emitter electrode 38. This alignment allows base electrode 40 to be fabricated relatively closely to both emitter electrode 38 and the collector electrode which is comprised of first portion 26 and second portion 36. The space between second portion 36 and emitter electrode 38 defines the lateral dimension of base electrode 40 and therefore is extremely important in defining the lateral dimensions of the entire device.

It should be understood that during the formation of base electrode 40, metal 42 will form on second portion 36 and also on emitter electrode 38. This metal may be left or may be removed so that an even more planar structure is achieved.

Thus it is apparent that there has been provided, in accordance with the invention, an improved method of fabricating heterojunction bipolar transistors having improved surface topology planarization especially between emitter and collector electrodes, decreased lateral dimensions and where the base electrode is self-aligned to both the emitter and collector electrodes. Though specific embodiments of the invention have been shown and described, further modifications and improvements will occur to those skilled in the art. It is desired that it is understood, therefore, that this invention is not limited to the particular forms shown and it is intended in the appended claims to cover all modifications which do not depart from the spirit and scope of this invention.

What is claimed is:

1. A method of fabricating a heterojunction bipolar transistor comprising the steps of:
   providing a substrate;
   forming one or more collector layers on said substrate;
   forming a base layer on said one or more collector layers;
   forming one or more emitter layers on said base layer;
   forming an opening extending through said one or more emitter layers and said base layer, said opening extending to said one or more collector layers;
   forming a first collector metal in said opening so that said first collector metal is not in contact with any sidewalls of said opening;
   forming dielectric material in said opening between said first collector metal and said sidewalls of said opening;
   forming emitter metal on said one or more emitter layers and a second collector metal on said first collector metal, said emitter metal and said second collector metal being substantially planar;
   exposing said base layer; and
   forming base metal on said base layer.

2. The method of claim 1 where the substrate comprises semi-insulating gallium arsenide, the one or more collector layers comprise a sub-collector layer and a collector layer both being comprised of gallium arsenide, the base layer comprises gallium arsenide and the one or more emitter layers comprise an aluminum gallium arsenide layer disposed on said base layer and a gallium arsenide layer disposed on said aluminum gallium arsenide layer.

3. The method of claim 1 wherein the forming an opening step includes forming a photoresist layer on the one or more emitter layers, forming a mask from said photoresist layer and using said mask to etch an opening extending to the one or more collector layers.

4. The method of claim 3 wherein the photoresist mask is lifted-off following the forming a first collector metal step.

5. The method of claim 1 wherein the forming dielectric material step comprises the steps of:
   forming a dielectric layer in the opening and on the structure;
   forming a photoresist layer on the dielectric layer; and
   etching said photoresist layer and said dielectric layer to the one or more emitter layers so that the structure is substantially planar.

6. The method of claim 1 wherein the exposing said base layer step includes removing the one or more emitter layers from the structure excepting that disposed beneath the emitter metal.

7. The method of claim 6 wherein the forming base metal step includes forming base metal between the emitter metal and the second collector metal so that said base metal is self-aligned to said emitter metal and said second collector metal.

8. A method of fabricating a heterojunction bipolar transistor comprising the steps of:
- providing a semi-insulating gallium arsenide substrate;
- forming a gallium arsenide sub-collector layer on said substrate;
- forming a gallium arsenide collector layer on said sub-collector layer;
- forming a gallium arsenide base layer on said collector layer;
- forming an aluminum gallium arsenide emitter layer on said base layer;
- forming a gallium arsenide emitter cap layer on said first emitter layer;
- forming a first photoresist mask on said second emitter layer;
- forming an opening using said first photoresist mask, said opening extending to said sub-collector layer;
- forming a first collector metal in said opening so that said first collector metal is not in contact with the sidewalls of said opening;
- removing said first photoresist mask;
- forming a dielectric layer on the structure including in said opening between said sidewalls of said opening and said first collector metal;
- forming a photoresist layer on said dielectric layer and etching through said photoresist layer and said dielectric layer to said emitter cap layer so that the structure is substantially planar;
- forming a second photoresist mask and using said second mask to form emitter metal on said second emitter layer and second collector metal on said first collector metal;
- removing said second photoresist mask;
- removing said emitter layer and said emitter cap layer excepting the portions disposed beneath said emitter metal to expose said base layer; and
- forming base metal on said base layer between said emitter metal and said second collector metal so that said base metal formation is self-aligned.

9. The method of claim 8 wherein the first collector metal comprises:
- a layer of gold-germanium alloy;
- a layer of nickel formed on said layer of gold-germanium alloy; and
- a gold layer formed on said nickel layer.

10. The method of claim 9 wherein the emitter metal and the second collector metal are comprised of the same metals as the first collector metal.

11. The method of claim 10 wherein the base metal comprises:
- a layer of titanium;
- a layer of platinum formed on said titanium layer; and
- a layer of gold formed on said platinum layer.

12. The method of claim 9 wherein the dielectric layer comprises silicon dioxide.

13. A method of fabricating a heterojunction bipolar transistor having planar emitter and collector electrodes comprising the steps of:
- forming an opening extending to a collector layer of the transistor structure;
- forming a first portion of a collector electrode in said opening;
- isolating said first portion with a dielectric;
- forming a second portion of a collector electrode on said first portion;
- forming an emitter electrode adjacent to and substantially planar with said second portion;
- exposing a base layer of the transistor structure between said second portion and said emitter electrode; and
- forming a base electrode on the exposed portion of said base layer between said second portion and said emitter electrode.

14. The method of claim 13 wherein the forming a second portion and the forming an emitter electrode steps are performed simultaneously.

* * * * *